(12) United States Patent
Lapir et al.

(10) Patent No.: US 7,908,430 B2
(45) Date of Patent: Mar. 15, 2011

(54) ASSOCIATIVE MEMORY

(75) Inventors: Gannady Lapir, Kirchzarten (DE);
Harry Urbshat, Kirchzarten (DE)

(73) Assignee: BDGB Enterprise Software S.A.R.L., Neuchatel (CH)

( * ) Notice: Subject to any disclaimer, the term of this patent is extended or adjusted under 35 U.S.C. 154(b) by 10 days.

(21) Appl. No.: 12/191,774

(22) Filed: Aug. 14, 2008

(65) Prior Publication Data

US 2009/0193022 A1 Jul. 30, 2009

Related U.S. Application Data

(63) Continuation of application No. 11/240,632, filed on Oct. 3, 2005, now Pat. No. 7,433,997, which is a continuation of application No. 10/362,027, filed as application No. PCT/EP01/09577 on Aug. 20, 2001, now Pat. No. 6,983,345.

(30) Foreign Application Priority Data

Aug. 18, 2000 (EP) .................................... 00117850

(51) Int. Cl.
*G06F 12/00* (2006.01)

(52) U.S. Cl. .................. 711/108; 707/999.003

(58) Field of Classification Search .................. 711/108; 707/999.003
See application file for complete search history.

(56) References Cited

U.S. PATENT DOCUMENTS

| | | | |
|---|---|---|---|
| 4,799,188 A | 1/1989 | Yoshimura | |
| 4,864,501 A | 9/1989 | Kucera et al. | |
| 5,191,525 A | 3/1993 | LeBrun et al. | |
| 5,201,047 A | 4/1993 | Maki et al. | |

(Continued)

FOREIGN PATENT DOCUMENTS

EP 0 320 266 6/1989

(Continued)

OTHER PUBLICATIONS

A. Krikelis et al., "Associative Processing and Processors" Computer, US, IEEE Computer Society, Long Beach, CA, US, vol. 27, No. 11, Nov. 1, 1994, pp. 12-17, XP000483129.

(Continued)

*Primary Examiner* — Hashem Farrokh
(74) *Attorney, Agent, or Firm* — DLA Piper LLP US

(57) ABSTRACT

A computer-implemented method of realizing an associative memory capable of storing a set of documents and retrieving one or more stored documents similar to an inputted query document, said method comprising: coding each document or a part of it through a corresponding feature vector consisting of a series of bits which respectively code for the presence or absence of certain features in said document; arranging the feature vectors in a matrix; generating a query feature vector based on the query document and according to the rules used for generating the feature vectors corresponding to the stored documents such that the query vector corresponds in its length to the width of the matrix; storing the matrix column-wise; for those columns of the matrix where the query vector indicates the presence of a feature, bitwise performing one or more of preferably hardware supported logical operations between the columns of the matrix to obtain one or more additional result columns coding for a similarity measure between the query and parts or the whole of the stored documents; and said method further comprising one or a combination of the following: retrieval of one or more stores documents based on the obtained similarity measure; and or storing a representation of a document through its feature vector into the above matrix.

1 Claim, 3 Drawing Sheets

U.S. PATENT DOCUMENTS

| | | | |
|---|---|---|---|
| 5,245,672 | A | 9/1993 | Wilson et al. |
| 5,267,165 | A | 11/1993 | Sirat |
| 5,276,870 | A | 1/1994 | Shan et al. |
| 5,344,132 | A | 9/1994 | LeBrun et al. |
| 5,537,491 | A | 7/1996 | Mahoney et al. |
| 5,546,503 | A | 8/1996 | Abe et al. |
| 5,619,709 | A | 4/1997 | Caid et al. |
| 5,649,068 | A | 7/1997 | Boser et al. |
| 5,671,333 | A | 9/1997 | Catlett et al. |
| 5,675,710 | A | 10/1997 | Lewis |
| 5,778,362 | A | 7/1998 | Deerwester |
| 5,787,201 | A | 7/1998 | Nelson et al. |
| 5,794,178 | A | 8/1998 | Caid et al. |
| 5,864,855 | A | 1/1999 | Ruocco et al. |
| 5,918,223 | A | 6/1999 | Blum et al. |
| 6,006,221 | A | 12/1999 | Liddy et al. |
| 6,043,819 | A | 3/2000 | LeBrun et al. |
| 6,076,088 | A | 6/2000 | Paik et al. |
| 6,101,515 | A | 8/2000 | Wical et al. |
| 6,115,708 | A | 9/2000 | Fayyad et al. |
| 6,161,130 | A | 12/2000 | Horvitz et al. |
| 6,185,576 | B1 | 2/2001 | McIntosh |
| 6,192,360 | B1 | 2/2001 | Dumais et al. |
| 6,212,532 | B1 | 4/2001 | Johnson et al. |
| 6,243,713 | B1 | 6/2001 | Nelson et al. |
| 6,275,610 | B1 | 8/2001 | Hall, Jr. et al. |
| 6,289,334 | B1 | 9/2001 | Reiner et al. |
| 6,324,551 | B1 | 11/2001 | Lamping et al. |
| 6,327,387 | B1 | 12/2001 | Naoi et al. |
| 6,477,551 | B1 | 11/2002 | Johnson et al. |
| 6,622,134 | B1 | 9/2003 | Sorkin |
| 6,665,668 | B1 | 12/2003 | Sugaya et al. |
| 6,732,090 | B2 | 5/2004 | Shanahan et al. |
| 6,741,959 | B1 * | 5/2004 | Kaiser .............................. 704/7 |
| 6,772,164 | B2 | 8/2004 | Reinhardt |
| 6,976,207 | B1 | 12/2005 | Rujan et al. |
| 6,983,345 | B2 | 1/2006 | Lapir et al. |
| 7,149,347 | B1 | 12/2006 | Wnek |
| 7,433,997 | B2 | 10/2008 | Lapir et al. |
| 7,509,578 | B2 | 3/2009 | Rujan et al. |
| 2001/0042083 | A1 | 11/2001 | Saito et al. |
| 2002/0022956 | A1 | 2/2002 | Ukrainczyk et al. |
| 2002/0023085 | A1 | 2/2002 | Keith, Jr. |
| 2002/0129015 | A1 * | 9/2002 | Caudill et al. .................... 707/6 |

FOREIGN PATENT DOCUMENTS

| | | |
|---|---|---|
| EP | 0 572 807 | 12/1993 |
| EP | 0 750 266 | 12/1996 |
| EP | 1 049 030 | 2/2000 |
| EP | 1049030 | 11/2000 |
| EP | 1 128 278 | 8/2001 |
| EP | 1 182 577 | 2/2002 |
| EP | 1 288 792 | 3/2003 |
| EP | 1 315 096 | 5/2003 |
| GB | 2172130 | 9/1986 |
| JP | 11-184894 | 7/1999 |
| WO | WO 88/01411 | 2/1988 |
| WO | WO 89/04013 | 5/1989 |
| WO | WO 91/10969 | 7/1991 |
| WO | WO 98/01808 | 1/1998 |
| WO | WO 98/47081 | 10/1998 |
| WO | WO 01 42984 | 6/2001 |
| WO | WO 01/63467 | 8/2001 |
| WO | WO 02/15045 | 2/2002 |
| WO | WO 03/019524 | 3/2003 |
| WO | WO 03/044691 | 5/2003 |

OTHER PUBLICATIONS

International Search Report issued in related International Application No. PCT/EP01/09577, mailed Nov. 5, 2003.

Office Action mailed in U.S. Appl. No. 10/362,027, mailed Jun. 17, 2005.

Motonobu Hattori, "Knowledge Processing System Using Mulit-Mode Associate Memory", IEEE, vol. 1, pp. 531-536 (May 4-9, 1998).

Notice of Allowance issued in U.S. Appl. No. 10/362,027, mailed Jul. 22, 2005.

Office Action Issued in U.S. Appl. No. 11/240,632, mailed Dec. 4, 2006.

Office Action Issued in U.S. Appl. No. 11/240,632, mailed Jul. 30, 2007.

Notice of Allowance issued in U.S. Appl. No. 11/240,632, mailed May 14, 2008.

Office Action issued in U.S. Appl. No. 09/561,196, mailed Oct. 6, 2003.

Office Action issued in U.S. Appl. No. 09/561,196, mailed May 24, 2004.

Notice of Allowance issued in U.S. Appl. No. 09/561,196, mailed May 19, 2005.

Notice of Allowance issued in U.S. Appl. No. 09/561,196, mailed Jul. 8, 2005.

Supplemental Notice of Allowance issued in U.S. Appl. No. 09/561,196, mailed Jul. 29, 2005.

Office Action issued in U.S. Appl. No. 11/240,525, mailed Oct. 5, 2007.

Notice of Allowance issued in U.S. Appl. No. 11/240,525, mailed Jun. 11, 2008.

International Search Report issued in International Application No. PCT/EP01/01132, mailed May 30, 2001.

H. Saiga et al., "An OCR System for Business Cards", Proc. of the 2nd Int. Conf. on Document Analysis and Recognition, Oct. 20-22, 1993, pp. 802-805, XP002142832.

Junliang Xue et al., "Destination Address Block Location on handwritten Chinese Envelope", Proc. of the 5th Int. Conf. on Document Analysis and Recognition, Sep. 20-22, 1999, pp. 737-740, XP002142833.

English Translation of Japanese Office Action issued in Application No. 2003-522903 mailed Jul. 29, 2008.

Machine Translation of JP 11-184894.

Simon Berkovich et al., "Organization of Near Matching In Bit Attribute Matrix Applied to Associative Access Methods in Information Retrieval", Pro. of the 16th IASTED Int. Conf. Applied Informatics, Feb. 23-25, 1998, Garmisch-Partenkirchen, Germany.

European Office Action issued in Application No. 01127768.8 mailed Sep. 10, 2008.

European Office Action issued in Application No. 01120429.4 mailed Sep. 16, 2008.

D. Frietag, "Information extraction from HTML: application of a general machine learning approach", Pro. 15th National Conference on Artificial Intelligence (AAAI-98); Tenth Conference on Innovative Applications of Artificial Intelligence, Proceedings of the Fifteenth National Conference on Artificial Intelligence, Madision, WI, USA pp. 517-523, SP002197239 1998, Menlo Park, CA, USA, AAAI Press/MIT Press, USA ISBN: 0-262-51098-7.

European Office Action issued in Application No. 01120429.4 mailed Jun. 30, 2006.

European Office Action issued in Application No. 01120429.4 mailed Apr. 23, 2004.

E. Appiani et al., "Automatic document classification and indexing in high-volume applications", International Journal on Document Analysis and Recognition, Dec. 2001, Springer-Verlag, Germany, vol. 4, No. 2, pp. 69-83, XP002197240, ISSN: 1433-2833.

A. Ting et al., "Form recognition using linear structure", Pattern Recognition, Pergamon Press Inc., Elmsford, NY, US, vol. 32, No. 4, Apr. 1999, pp. 645-656, XP004157536, ISSN: 0031-3203.

International Search Report issued in International Application PCT/US02/27132 issued Nov. 12, 2002.

"East text search training", Jan. 2000.

European Search Report issued in European Office Action 01120429.4 mailed Jul. 19, 2002.

International Search Report issued in International Application PCT/DE97/01441, mailed Nov. 12, 1997.

Voorhees et al., "Vector expansion in a large collection", NIST Special Publication, US, Gaithersburg, MD pp. 343-351.

M. Marchard et al., "A Convergence Theorem for Sequential Larning in Two-Layer Perceptrons", Europhysics Letters, vol. 11, No. 6, Mar. 15, 1990, pp. 487-492.

F. Aurenhammer, Voronoi Diagrams—"A survey of a fundamental geometric data structure", ACM Computing Surveys, vol. 23, No. 3, Sep. 1991, pp. 345-405.

C. Reyes et al., "A Clustering Technique for Random Data Classification", International Conference on Systems, Man and Cybernetics, IEEE, p. 316-321.

International Search Report issued in PCT/EP00/03097 mailed Sep. 14, 2000.

International Preliminary Examination Report issued in PCT/EP00/03097 mailed Jul. 31, 2001.

Written Opinion issued in PCT/EP00/03097 mailed Apr. 21, 2001.

Japanese Office Action issued in Japanese Application No. 2003-522903, mailed Jul. 29, 2008.

English language translation of Japanese Office Action issued in Japanese Application No. 2003-522903, mailed Jul. 29, 2008.

European Office Action issued in European Application No. 01 905 729.8, mailed Nov. 22, 2007.

Foreign Office Action issued in EP 00117850.8 mailed May 20, 2008.

Foreign Office Action issued in EP 00117850.8 mailed Jul. 20, 2006.

EP Search Report issued in EP 00117850.8 mailed Jun. 12, 2001.

International Notification issued in PCT/EP00/03097 mailed May 5, 2001.

G. Lapir, "Use of Associative Access Method for Information Retrieval System", Proc. 23rd Pittsburg Conf. on Modeling & Simulation, 1992, pp. 951-958.

Witten et al., "Managing Gigabytes" pp. 128-142.

C.J. Date, "An Introduction to Database Systems, Sixth Edition", Addison-Wesley Publishing Company, pp. 52-65 (1995).

International Search Report for PCT/US00/23784 mailed Oct. 26, 2000.

Australian Office Action in Australian application 2002331728 mailed Nov. 16, 2006.

Australian Notice of Acceptance issued in Australian application 2002331728 mailed Feb. 20, 2008.

Foreign Office Action issued in EP 01127768.8 mailed Feb. 5, 2007.

Foreign Office Action issued in EP 01127768.8 mailed Sep. 8, 2005.

Bo-ren Bai et al. "Syllable-based Chinese text/spoken documents retrieval using text/speech queries", Int'l Journal of Pattern Recognition.

Foreign Search Report issued in EP 01127768.8 mailed Sep. 12, 2002.

European Search Report issued in EP 00103810.8, mailed Aug. 1, 2000.

European Office Action issued in EP 00103810.8, mailed May 23, 2002.

International Preliminary Examination Report issued in International Application No. PCT/DE97/01441, mailed Jul. 21, 1998.

European Office Action issued in EP 00926837.6, mailed Nov. 28, 2006.

European Office Action issued in EP 00926837.6, mailed Oct. 11, 2007.

Australian Office Action issued in AU 2001282106, mailed Jul. 18, 2006.

Australian Office Action issued in AU 2001233736, mailed Aug. 26, 2005.

Australian Office Action issued in AU 2001233736, mailed Aug. 23, 2006.

European Office Action issued in EP 97931718.7, mailed Jul. 9, 2001.

European Office Action issued in EP 97931718.7, mailed May 8, 2002.

International Search Report issued in International Application No. PCT/EP98/00932, mailed Jul. 28, 1998.

Richard G. Casey et al., "A Survey of Methods and Strategies in Character Segmentation", IEEE Transactions on Pattern Analysis and machine Intelligence, vol. 18, No. 7, pp, 690-706 (Jul. 1996).

File History of U.S. Appl. No. 11/240,525 on Sep. 16, 2010.
File History of U.S. Appl. No. 09/561,196 on Sep. 16, 2010.
File History of U.S. Appl. No. 11/240,632 on Sep. 16, 2010.
File History of U.S. Appl. No. 10/362,027 on Sep. 16, 2010.
File History of U.S. Appl. No. 12/106,450 on Sep. 16, 2010.
File History of U.S. Appl. No. 12/208,088 on Sep. 16, 2010.
File History of U.S. Appl. No. 10/204,756 on Sep. 16, 2010.
File History of U.S. Appl. No. 12/588,928 on Sep. 16, 2010.
File History of U.S. Appl. No. 12/610,915 on Sep. 16, 2010.
File History of U.S. Appl. No. 12/610,937 on Sep. 16, 2010.
File History of U.S. Appl. No. 12/570,412 on Sep. 16, 2010.
File History of U.S. Appl. No. 12/106,450 on Nov. 10. 2010.

Office Action issued in Canadian Patent Application No. 2,459,182, mailed Oct. 26. 2010.

* cited by examiner

ASSOCIATIVE MEMORY

CROSS-REFERENCE TO RELATED APPLICATIONS

This application is a continuation of Ser. No. 11/240,632 filed Oct. 3, 2005, which is a continuation of Ser. No. 10/362,027 filed Feb. 19, 2003, now U.S. Pat. No. 6,983,345, which is the National Stage filing under 35 §371 of International Application No. PCT/EP01/09577, filed Aug. 20, 2001. The entirety of all of the above-listed Applications are incorporated herein by reference.

The present invention relates to an associative memory, and in particular to the retrieving and storing using such an associative memory.

DESCRIPTION OF THE RELATED ART

Learning is the ability of an organism or artificial system to acquire and store (memorize) environmental information whose content cannot not predefined through genetic or deterministic rules. This definition shows that learning is closely related to storing and retrieving information.

Living beings MUST have good developed mechanisms for this task: indeed, biological entities like the human brain and immune system are the best known examples proving the existence of efficient "algorithms".

Many biologists consider the question of memory as the brain's "Rosetta Stone": a well defined riddle, which when answered opens the way to understanding other cognitive functions as well. Although modern experimental techniques like NMR (nuclear magnetic resonance) allow a direct imaging of brain activity, it is almost sure that the human memory is not strongly localized. The idea that when I recognize my grandmother a certain neuron in my brain becomes active—the so-called "grandmother neuron" hypothesis—has been given up long time ago.

When asked when I met Mr. XYZ for the first time one can give a correct answer in a few hundred milliseconds time, while "searching" through millions of similar and billions of different memory traces. And all this is done with the help of very (many millions of) sluggish cells, whose typical response time is well above 1 millisecond.

What is the secret of this fantastic database? Of course, we do not know it yet but certain features have been unmistakably already been identified.

These can he summed together as a set of requirements such a memory device should have:

The data is stored in a distributed fashion: a text string would be stored as a certain configuration of features (set bits) which, however, are distributed more or less randomly over the whole system.

Therefore, even if some part of the system is destroyed (the brain is slightly injured), an imperfect image of the original can be still retrieved (the system is said to be fault tolerant).

The data is recovered solely based on its content, not on its address (remember, the system does not have addresses at all).

The data is strongly related to other such patterns through associations.

The writing, association, and reading mechanisms are parallel, independent processes.

An associative memory would desirably fulfill all these conditions: it is parallel distributed, content addressable, and robust (failure tolerant).

Some existing models of associative memories are now briefly described in the following.

The basic approach of the called Kohonen network is that the neurons perform automatically a kind of clustering of the input features and reduce at same time the dimensionality of the input.

Assume that the objects we are describing have some characteristic features—for our purposes it is enough to represent them as a set of such features. If we talk about a ball, for instance, such features could be the radius, the material is made from, its color, and perhaps the kind of sport it is used for.

If we take a piece of text, such features could be the language, the length, and the number of words in the text.

Therefore, one instance of the analyzed objects is described by a feature to vector of 3; 4 or 100 dimensions. This is the feature space of the objects.

Next, let us assume that there is a two-dimensional square lattice of 16 neurons, which should somehow "learn" to represent this high dimensional feature. This is the neuronal space.

Kohonen's algorithm defines for each neuron an internal "storage" whose dimension equals that of the feature space and a procedure of "training" the neuronal system by presenting at random example objects in feature space.

As a result, we obtained set of cluster centers (the neurons), being responsible for a whole region of objects in feature space. Note that the cluster centers are living in two-dimensions, making a graphical representation of high dimensional featured objects possible. The Kohonen algorithm unifies clustering (or vector quantization) with dimensionality scaling. Next the cluster centers can be associated with some operational maps. The Kohonen maps have been used most often to associate sensory maps (the visual input of a robot) to motoric maps (the motoric output controlling the robot's motion).

Another typical model is the Hopfield (CalTech) model for so autoassociative memory, developed in the early 80's. This model is based very strongly on physical analogies and on the concept of energy. Everybody knows that if you throw a ball into a hole, the ball will eventually settle down at the bottom of this hole. A physical system is said to be in its ground state if it approaches the state of minimal (potential) energy.

Hopfields idea was to "create" (learn) a whole energy landscape with holes of equal depth, If we throw a ball into this system, it will rest on the bottom of one of these holes.

If we throw the ball not very far away from the bottom of a hole, it will go there. The difficult problem in this simple idea is how to define the holes such that to the bottom corresponds to useful information, or a special combination of features which are defined by some examples given to the system. Then slightly perturbed variants of this pattern will all "relax" to the good pattern. Such automatic correction mechanisms are, of course, very useful in associating input patterns to some predefined "representant" or "canonical" pattern. The Hopfield model has a very is simple learning rule but is not particularly fast or scalable.

Another known approach of associative search is based on representing documents as bitstrings and searching for those documents where certain bits as defined in a query string are set. Such a method is e.g. described in "Managing Gigabytes", by Written et al (Morgan Kaufmann Publ, 1999), on pages 128 through 142.

It is an object of the present Invention to provide an associative memory which is efficient and flexible in retrieving and/or storing.

SUMMARY OF THE INVENTION

According to the present invention there is provided an associative memory which is capable of retrieving documents in response to an input query based on a similarity measure evaluating the similarity between the query and the documents stored in the associative memory. Arranging the memory in a matrix, performing logical operations based on the columns of the matrix identified by the query, and thereby obtaining a plurality of result columns coding for a similarity measure enables to identify documents together with a similarity degree for the similarity between the documents and the query.

Preferably the logical operations are hardware supported operations (Boolean operations supported by a microprocessor for its register content), thereby the operation becomes very fast.

Preferably the matrix is stored columnwise, this makes access to those columns identified by a query very fast.

BRIEF DESCRIPTION OF THE DRAWINGS

For a more complete understanding of the present invention, reference is now made to the following descriptions taken in conjunction with the accompanying drawing, in which.

Figure 1:
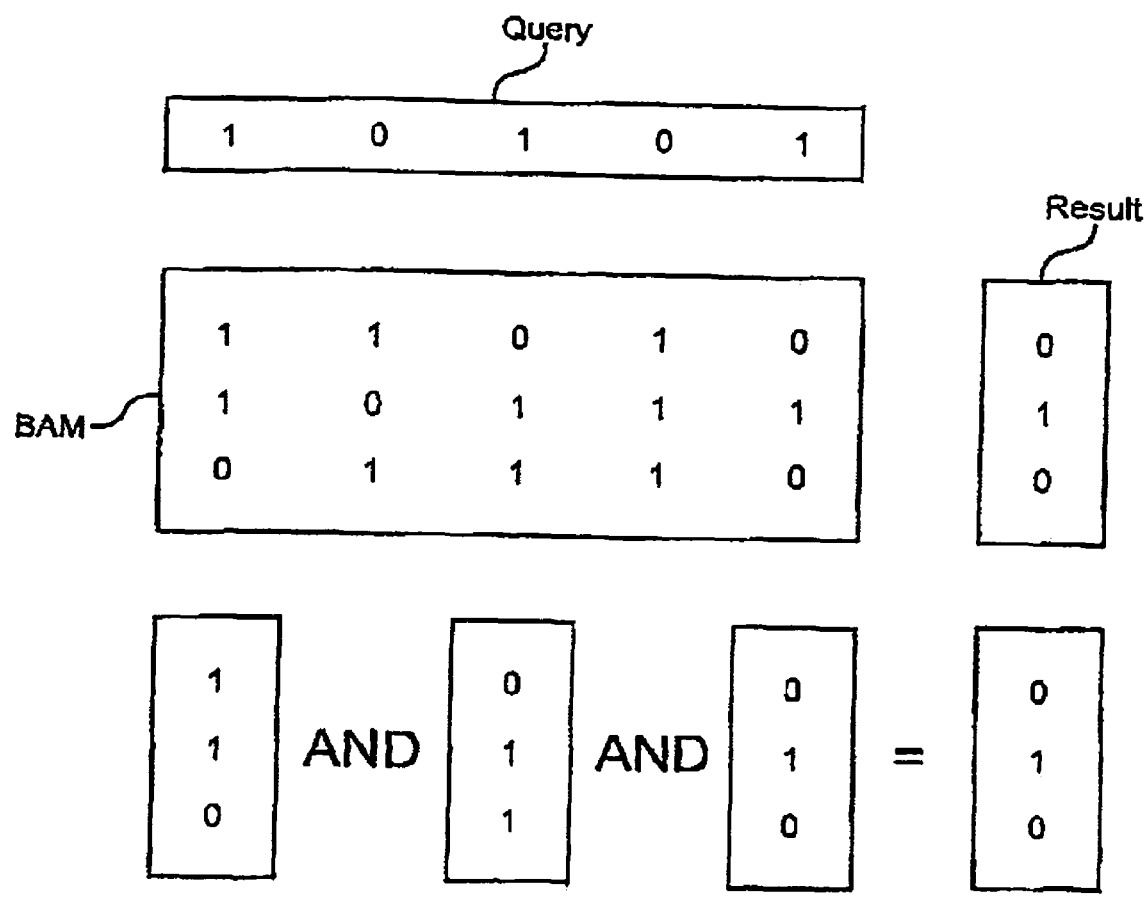
FIG. 1 is a diagram of a query string or vector and a plurality of document vectors stored in as a Bit-Attribute-Matrix and the vectors resulting from their logical combination according to an embodiment of the invention.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

DETAILED DESCRIPTION

One embodiment of the present invention is an implementation of a "searching through example" protocol: given a document which is chosen by the user as to contain the type of content she is searching for, the system finds the best fitting—and if required—all documents which are similar to the example. In general, finding similar objects to a given one involves the definition (and computation!) of some similarity measure.

If we wish to retrieve some information based on its content rather than based on some search key or memory address, we must first represent the document's information. The term document as used In the following may mean a whole file or text document, or a fraction of a whole document such as a page, a paragraph, or any smaller unit of the whole document.

Before pattern recognition methods can be applied we have to express usual text into some typical features. In an embodiment of the present invention there are two types of features: one expressing orthographic and a second one so expressing meaning (semantic) similarity. The semantic similarity is enforced through a "semantic class table", which expresses each word as a set of the concept classes it belongs to. In the present embodiment this is done by representing the text of a document through a coding which codes for the presence or absence for certain trigram in the document text. Assuming 32 possible character this leads to $32^3$ possible trigrams requiring a bitstring of the length $32^3$. Each trigram is assigned a certain number, and if the text document contains a certain trigram being numbered n then the n-th bit in the bitstring will be set. This results in a bitstring having $32^{\wedge}$ bits which codes for the presence or absence of certain trigrams in the text.

It will readily be understood that this is only one possible feature coding, other features such as unigrams, diagrams, words, etcetera could be coded as well for their presence or absence through a bitstring generated in a similar manner.

The system may of course use also a combination of different representations of such text, such as a combination of diagrams and trigrams.

As an example the term "extension" consists of the monograms "e"+"x"+"t"+"n"+"s"+"i"+"o"+"n", the diagrams "ex"+"xt"+"te"+"en"+"ns"+"si"+"io"+"on", etc.

Note that once coded in this way we loose information about how many times a letter, diagram, etc. and in what order they occurred in the corresponding word. However, if these features are quite different we can be sure that the corresponding words are also quite different. Inversely, if two feature vectors are similar this does not automatically mean that the underlying text IS necessarily identical.

There is still a further possibility as to which type of features can be coded for their presence or their absence. One example is to use the semantics of the words contained in a text. For that purpose e.g. there are compiled lists of words which are similar or identical their meaning and such groups of words of respectively similar or identical meanings then belong to the same group or "class" (semantical class).

One such class could e.g., comprise the words chair, seat, bank, sofa. They all have the same or at least a similar meaning in the sense that they are things on which one can sit down.

Another group or class could then comprise e.g. the words door, gate, entry. They all are similar in the sense that one can enter some place through the entities which belong to this group or class.

One can compile several of those groups or classes, and after they have been compiled one then can check whether in the text there are occurring words belonging to one or more of the classes. Based an whether or not words of a certain class occur in the text the feature vector is formed, e.g. if words belonging to class 3, 5, 17 an 29 occur in the text, then the corresponding bits in the feature vector are set. The feature vector thereby in one embodiment has at feast as many bits as classes have been compiled.

The classes themselves and their organizational scheme can largely depend on the definitions chosen, i.e. which type of classes have been compiled and how many of them. There may be classes which are formed very narrowly such that they contain only synonyms; and other ones which contain words which are similar or correlated on a much more abstract level, e.g. in the sense that they relate to the same general field such as economics, sports, science, etcetera. Such more abstract "concept classes" represent meaning of the text in a more abstract manner than individual words do. Based on this concept different hierarchical levels of such "concept classes" can he compiled, and they all may be taken into account when forming the "final" feature vector coding for the features occurring in the text document. This means that the final feature vector may have one bit for each.

It should be understood that the possible ways of coding for the presence or absence of features as described above can be used alternatively, but they can also be used in combination as well. Depending of the type and the number of features which are to be coded the feature vector may become very long.

After having described several possibilities how the feature vector can be formed, it will now be described how it can be employed for search and retrieval.

The representation of text through a feature vector as described before is applied to retrieve based on a query document similar documents from a database. For that purpose the query document (or query text) as mall as the documents of the database which is searched are represented through corresponding feature vectors as will be explained in more detail below. The documents to be searched (or better: their corresponding feature vectors) are arranged in form of a matrix, and the query document also is expressed as its corresponding feature vector.

In one embodiment, in a first step, it is tried to eliminate non relevant documents. This is done by logical operations on those matrix columns Identified by the query. This results in a set of candidates together with a corresponding similarity measure. Based on this similarity measure there is obtained a reduced set of candidates, e.g. by selecting only the most relevant candidates having the highest similarity measure.

This operation still is based on logical operations on the matrix to thereby obtain the reduced set of candidates.

In a further embodiment, after having reduced the data to a small number of potential candidates there is made an attempt to measure the similarity between the query and the candidate documents based on the actual textual content of the query and the reduced set of document candidates. This is the second phase.

In a further embodiment both approaches are combined and executed consecutively.

As explained before, the already stored documents which are to be searched and the query document are to be represented by corresponding feature vectors arranged in a matrix. For large documents stored this can be done by dividing them into smaller units of some defined length which then are individually represented through their feature vectors.

E.g., in one embodiment a document is seen as a hierarchically structured set of smaller objects. Take for instance a typical press article or web page. These documents consist of several units we call pages, such of about 1 Kbytes size. This corresponds in length to one to two paragraphs.

One may expect that this unit is small enough so that its content is more or less unique in its topic; only a single topic or idea is expressed in it. A page is itself a collection of called fragments, whose length is a free parameter (selectable by the user) but lies around 32 bytes (letters). The fragments are usually containing one or more words. The method of representation-through bitstrings can be applied to any of these units, in the following we just for example choose as a unit a so-called page (about 1 kbyte). Each page is stored as a representation its features through a feature vector. For simplicity we here assume that in this embodiment the feature vector only codes for the presence or absence of trigrams. Thereby a matrix is formed, the so-called bit attribute matrix in which one row is a feature vector coding for the features of a corresponding page.

As already mentioned, in one embodiment there can be implemented in software an associative memory based on a representation through feature vectors, their arrangement in a matrix together with a query document and subsequently the performance of logical operations thereupon. Indeed, it can be shown that all computable functions can be mapped into a sequence of two operations: selecting a number of columns of a matrix representation of the stored documents and performing an arbitrary logical bit-by-bit operations on the selected columns. In the following we consider in somewhat more detail an example of such a matrix representation.

TABLE 1

| url 1 | this is the text of the first page | 0101010101000001010100001010010101010 101 |
| url 2 | this is the text of the second page | 0001111100001010100010101010100001010 |
| url 3 | Yet another page the document | 0101000000001010001001000010010010000 |

The table shows a small portion of the so-called bit-attribute matrix The coding (bitstrings) is only schematic.

If we have a method to map a page of text into a characteristic set coding for the presence (absence) of a certain feature, then we can map the pages into the structure shown in Table 1 called the Bit-Attribute-Matrix (BAM). Note that each row here corresponds exactly to a page of text (in other embodiments this correspondence may be to another unit of text such as a certain number of words or characters) and there is an associated reference pointer (or URL) associated to each, allowing one to retrieve later the whole text.

The coding in the present embodiment represents the presence or absence of trigrams in the text, whereas each possible trigram is assigned an identification number. The bit string may then have the length corresponding to the number of possible trigrams, and if a certain trigram is present in the text, then the corresponding bit in the bit string is set to one.

A more efficient way is to fold the range of possible ID-numbers to a smaller one, e.g. by dividing the ID-number for a trigram which is present in the page by a certain number, preferably a prime number, thereby obtaining a smaller ID-number and a correspondingly smaller bit siring in which the bit corresponding to the smaller number is set if the feature is present in the text. This involves a loss of information due to the fad that more than one feature may be represented by the same bit or column, however it reduces the necessary memory space.

The BAM has a width defined by the system parameters which define how the presence or absence of certain features is coded. It has a height which equals the number of pages we have to store (and which are to be searched). Any to query will be also brought into this standard feature format. This means any query text is also represented through a bitstring which has been generated using the same coding scheme as used for generating the BAM.

It should be understood that the formation of the bitstrings and the corresponding bit attribute matrix can be based on any features which somehow represent the content of the text to be represented, and it can also be based on any combination of such features. E.g. the bitstring could be formed by a concentration of a part coding for diagrams, a part coding far trigrams, a part coding for semantic content as represented through semantic classes explained before, and so on. Depending on which features are chosen to form the bit attribute matrix its size changes, as can be understood from the foregoing, and the size of the query document consequently changes as well, because the bitstring representing the query document is formed based on the same rules as the rows of the bit attribute matrix representing the documents to be searched.

Now the query process itself will be explained in somewhat more detail with reference to FIG. 1. The 1's of the query bitstring tell us which columns of the BAM should be investigated. Hence, the selection process is defined by a horizontal "register" of the same width as the BAM, in which the query is stored and whose set elements indicate a relevant column. The selected columns are shown in FIG. 1 below the bit attribute matrix. For the columns selected than there is carried out an adding with a bit-by-bit AND in sequential order for the selected columns. The result is stored In an additional vertical register shown on the right-hand of FIG. 1. It is easy to see that in each AND-step the number of selected rows will roughly decrease by the amount of zeros in one selected column. If the search is exact, we will keep in the and only those rows, which survived the AND-ing operations. This means that only those pages which have all, the features of the query will show up in the result column. Based on the result column the corresponding document(s) then can be retrieved.

FIG. 1 schematically Illustrates this process. For simplicity purposes of the present illustration, only the BAM is extremely small. The query selects columns 1, 3, and 5, they are ANDed as indicated in the lower part of FIG. 1 to obtain the result column.

Figure 2:
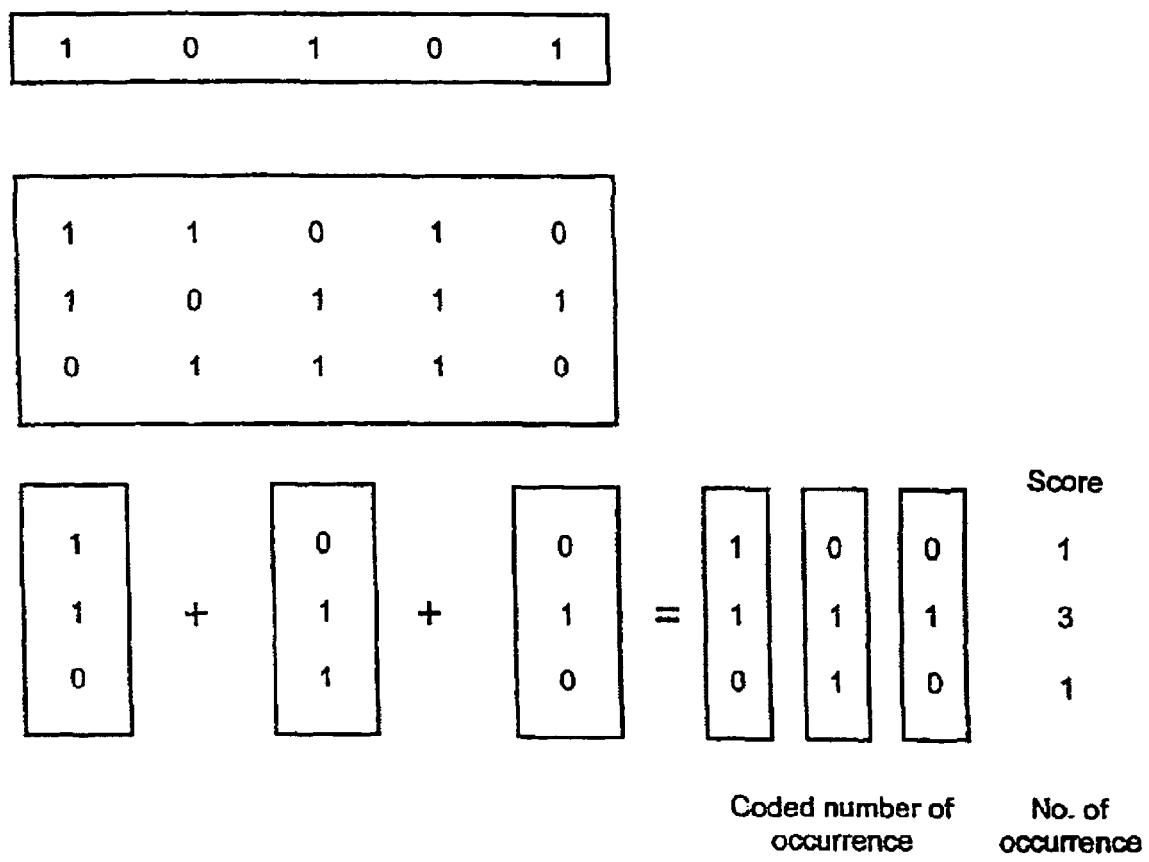
FIG. 2 is a diagram of a query string and Bit-Attribute-Matrix and the resultant match scores generated according to an embodiment of the invention.

If e.g. in a further embodiment the search is to allow orthographic errors (or non-exact occurrence of certain features defined by the query), one can keep in further vertical registers the results of adding page penalties as shown e.g. in FIG. 2. This can be done by e.g. counting for a certain row of the matrix the number of logical ones which appear in the positions indicated by the query string. The result may then be stored in a vertical coded form in a plurality of result columns. To one row of the matrix then there belong multiple result bits which can be evaluated in order to perform a selection of the candidates.

The result columns again farm a result matrix, and one row of the result matrix consists of a sequence of bits which may represent a coding of the frequency of occurrence of logical ones in the rows of the matrix at the positions indicated through the query string. For the example of FIG. 1 this is schematically illustrated in FIG. 2. The result columns code for the number of occurrence of 1's, as can be easily seen from FIG. 2.

In a further embodiment, the coding may not be a coding of the absolute number of occurrence, but it is also possible to code whether the number of ones lies in a certain range of occurrence frequency. Assume which have two result columns, then in total four ranges can be mapped, and than if the maximum possible occurrence is e.g. N, then 0 to N/4 may be mapped into range 1, from N/4+1 until N/2 may be mapped into range 2, and so on.

More complicated coding schemes are of course also possible. However, the result columns may always be obtained by performing one or more logical operations on the selected columns of the matrix, thereby enabling them to be efficiently carried out through hardware supported operations, such as microprocessor operations on registers.

Thereby a score for a document unit (here a page) can be obtained. A whole document may be split up into smaller units, for each of the units the score can be obtained and the scores may finally be added to finally select the document with the highest score. Another possibility would be to choose the document for which a certain unit has returned the highest score.

Document retrieval can be such as to obtain a list of documents based on a score threshold (the best document(s)), it may be combined with a limit set by the user for the number of returned documents, or the like.

It should be understood here that the query selects certain columns of the bit attribute matrix, and for the selected columns some further logical operations may be performed in some embodiments which give a resulting scare for the individual rows of the matrix formed by the selected columns. Based thereupon retrieval of documents can be performed taking into account the score obtained for the individual documents or parts thereof (such as pages, etcetera. as explained before).

One implementation of an embodiment is such that the BAM and all its registers are stored columnwise, allowing that all of the above described operations are performed using the hardware supported bit-by-bit operations. This means that in one processor operation one can process simultaneously 32, 64 (or 128) pages et once, depending on the actual processor architecture.

If the matrix is stored column-wise, then it is also very easy to eliminate those columns where the query bitstring has a logical zero. Only those columns are used for the further processing where the corresponding bit in the query bitstring is set, and thereby the total number of columns can be easily reduced significantly and a new matrix is formed containing only those columns which have been selected as relevant by the query bitstring.

Once a sorted list of potential candidates has been established (based on the scores), in a further embodiment one may start a second phase which may further improve the result. The original text of the candidate documents in this phase is now directly compared with the original (textual) content of the query. This can be done word-wise, fragment-wise, and/or page-wise. The document scores can be obtained as a function of the page scores.

This detailed comparison can be done as follows. At first for each word in the query there is found a counterpart in each candidate document, the counterpart being the word which is most similar to the query word. If there is no identical word in the candidate document, then the difference between the query word and the most similar word in the candidate document is expressed by a score indicating the similarity degree. One possible score might be calculated on the Loewenstein-distance between the two words. Thereby an "orthographic similarity score" may be obtained.

Then the sequential order of the query words can be compared with the sequential order of their counterparts in the candidate document. The result of this comparison again gives a sequential score indicating the sequential similarity.

Then the distance between the identified counterparts of the query words in the document candidate may also be taken into account to obtain a distance score, a high distance being punished.

Based on the orthographic similarity score, the sequential score and the distance score then there may be obtained a final similarity score which indicates the similarity between the candidate documents and the query. Based on this final similarity score then one or more final candidates may be selected for retrieval.

Of course other ways of calculating the final score are possible as well. The purpose of the calculation of the final score is to obtain a score which represents the similarity between the query and the documents obtained through the operations using the bit attribute matrix such that the most similar documents can be retrieved. Any similarity measure may therefore be used to get further information about how similar the query and the initially retrieved documents are in order to obtain a final score based on which the final retrieval judgment as to which documents actually are to be retrieved is made.

In comparison with the usual methods for full text indexing, the present embodiment has several advantages. It does not depend on the used language. For example, one does not need to load a list of stop-words (very frequent words whose function is to "glue" together a sentence). Such words lead to trigrams which are encountered so often that the corresponding columns in the BAM are "full"—such columns are automatically discarded because they do not help in eliminating candidates. Furthermore, one can use quite complex similarity measures to achieve a very good precision, since the initial step already significantly reduces the number of relevant candidates.

The described embodiments can further be varied in a manifold of ways.

By adding additional fields (columns) to the BAM one can, for example, enforce searching only on same subset of all examples. One such extended field could be the class of the document obtained through any classification engine which automatically classifies documents according to a classification scheme. The classification may be an neural network, it may also be a classification engine as described in European patent application with the application number 99108354.4 filed on Apr. 28, 1999 by the applicant of the present application. This application is hereby Incorporated by reference as a whole.

By using such additional fields one can already initially concentrate the algorithmic efforts into the relevant part of the database, e.g. by eliminating those documents where the classification does not match with the query.

Since in the present embodiment the memory allocation happens columnwise, it is easy to extend a BAM in width (compared to adding further text to and thus extending it in depth). Any search key index can be in this Stay added to the BAM, so that the system is able do perform also all desired data bank functions in a very flexible, extendable way.

The embodiments described create and handle internally a few big objects: one is a structured full text cache (which contains the stored documents as a whole) and the BAM itself. Such objects will have appropriate methods so that they can be loaded from a stream at initialization and saved into a stream when the associative memory is destroyed.

Apart from these functions, there is some further functionality related to storing. The cache administrator can send a document suing to the engine required that it is stored The same functionality is provided also for a whole set of documents.

In one embodiment, in response to sending a Query-document to the associative memory the user gets back a list of hits, and possibly their scores. Thereby not only similar documents can be found but also documents whose fragments are used for querying.

In other cases it might want to find ALL relevant documents which can be found, no matter how long that might takes.

In one embodiment the results are sent back in packages, so the user has from the beginning what to do (while the associative memory crunches on). Another parameter instructs the engine WHAT to send back. One option is only URLs+confidence, the other one is URL+relevant text+confidence. The answer will contain a list, whose length is yet another possible query parameter, of such items. Other options are the setting of the allowed retrieval error (how precise the query words should be found in the retrieved documents) and the inclusion of attributes and keywords. An attribute is a special word which has been so defined during the storing command. A typical article should have an AUTHOR, AUTHOR—AFFILIATION, TITLE, PUBLISHER DATUM, etc as possible attributes associated to it. The query with such attributes will be done only on the documents having such attributes and will do a fizzy search for the content of the attribute. Another possible attribute is the classification attribute as defined through any classification engine.

The keywords play a different role: adding a (+/−) keyword will (de)select from the answer candidates those where these words can be exactly found.

Finally, in a further embodiment it is possible to refine a search by restricting the search to the already found documents.

According to a further embodiment an associative memory is used to generate a classification scheme for a classification engine. Assume that there is a so large volume of unclassified data, then it may be difficult to find some datasets which are suitable to be used as a learning input to a classification engine making the engine to learn a certain classification scheme.

Using the associative memory this becomes very easy. One just generates a query document such that it is a typical representation of a desired class of the classification scheme. Sending this query to the associative memory one will obtain a set of documents being highly similar in content to the query document. Those documents can then be used to train the classification engine for that class or as new queries when the scope of the search is to be extended through iterations.

As already mentioned, a classification class can also be represented in the BAM as a feature, thereby refining the results obtained through the associative memory. In this manner a combination of a classification engine and associative memory can become extremely powerful. A classification can be incorporated into the BAM, this improves the associative retrieval, this can he used to improve the classification, e.g. by increasing the number of documents which belong to a certain class by assigning retrieved documents to a certain classification class, or by using the retrieved documents as a set of learning examples. The improved classification (either refined fn accuracy by re-learning or extended through additional classes or with expanded content in the clams through assigning) may be again (in whole or in part) be incorporated into the BAM (e.g. by adding further columns to the BAM), and so on. Using such an iterative process far a combination of a classification engine and an associative memory can then lead to a self-improving or self-learning system.

The continuous improvement may also start with the classification engine instead of the associative memory, e.g. by retrieving documents of certain classes, using them as query to the associative memory, using the query result the classification engine may be improved, and so on.

Figure 3:
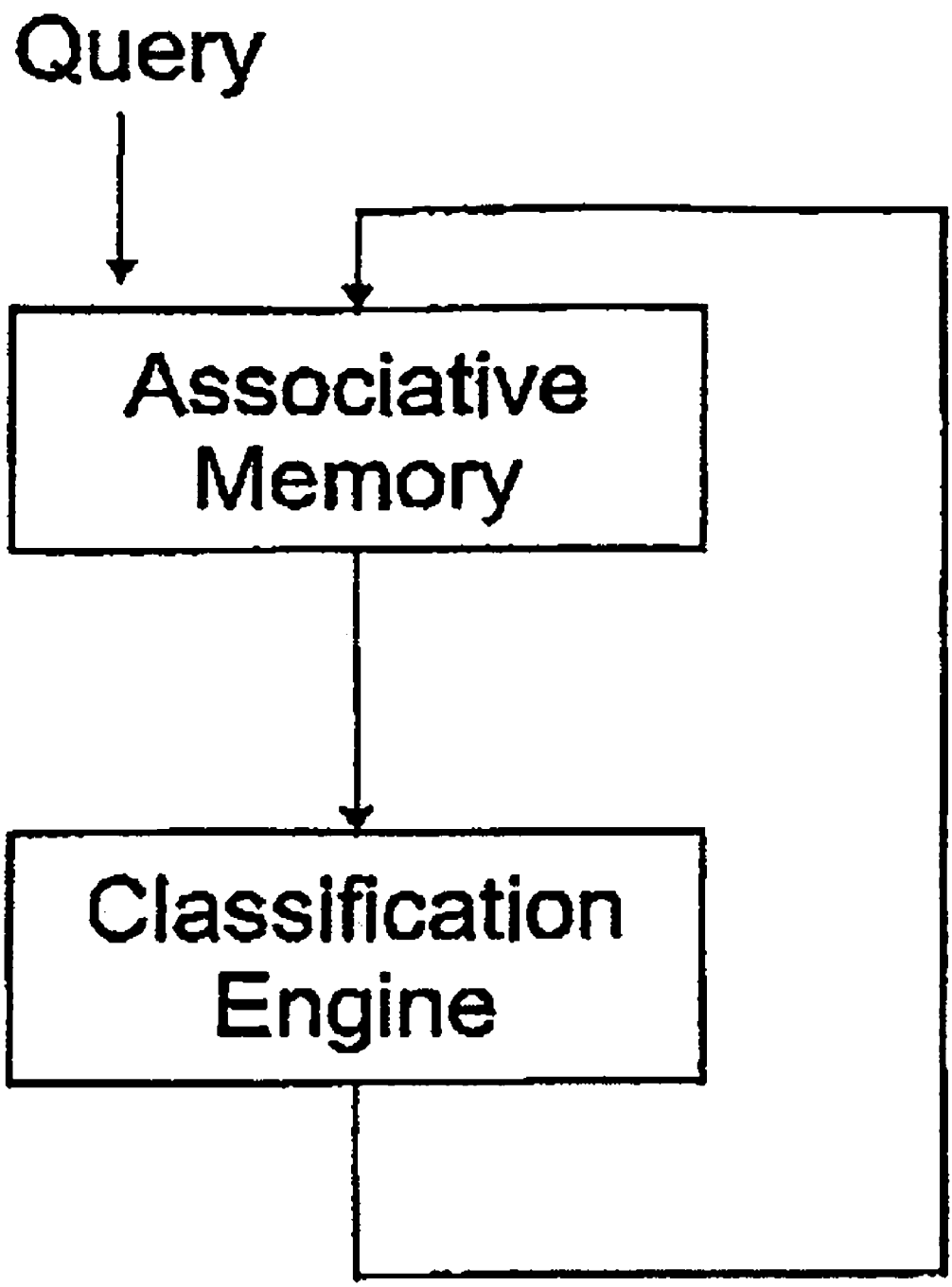
FIG. 3 is a block diagram of a self-improving classification engine for associative information retrieval according to an embodiment of the invention.

Alternatively a set of unknown documents may be classified using the classification engine, thereby the content of the engine (or the database) will increase, the so improved classification engine may be used again for associative retrieval, and so on. FIG. 3 schematically illustrates such a self-improving system.

This is applicable to any classification engine, e.g. a neural network. As particularly well suited classification engine would be the one described in European patent application with the application number 99108354.4 already mentioned before.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A computer-implemented method of simulating an associative memory capable of retrieving a document similar to an inputted query document from a set of stored documents, the method comprising:
    coding all documents of the set through a plurality of feature vectors, each feature vector belonging to a particular document or part of the particular document of the set and comprising a series of vector elements which relate to certain features present or absent in the particular document or part of the particular document, the feature vectors each comprising a series of bits as vector elements, wherein each feature of the certain features is associated to one particular bit of the series of bits, the particular bit being set to a logical one if the associated feature is present in a respective document or part of the respective document, so that the series of bits codes for the presence or absence of certain features in the respective document or part of the respective document of the set;
    arranging the feature vectors in a matrix, so that the rows of the matrix each are associated to the particular document or part of the particular document of the set and corresponds to a respective feature vector of the plurality of feature vectors, the matrix being stored column-wise to provide that respective bits of each respective matrix column, which respectively are set or not set to a logical one, are simultaneously processed in one processor operation by a processor used for obtaining the result column;
    generating a query feature vector based on the query document and according to the rules used for generating the feature vectors corresponding to the set of stored documents such that the query vector corresponds in its length to the length of a row of the matrix, the query feature vector consisting of the series of bits as vector elements, wherein each feature of the certain features is associated to one particular bit of the series of bits, the particular bit being set to a logical one if the associated feature is present in the query document, so that the series of bits codes for the presence or absence of certain features in the query document;
    obtaining, on basis of the matrix and the query feature vector, a result column coding for a similarity measure to indicate a similarity between the query document and all documents or parts of documents represented in the matrix, wherein in order to obtain the result column a logical operation is performed on those columns of the matrix for which the respective bit of the query vector is set to a logical one, so a result vector is obtained which codes the similarity measure between the query document and the documents or parts of the documents of the set, the logical operations comprising a logical operation performed bitwise between the bits of those columns of the matrix;
    retrieving one or more stored documents based on the obtained similarity measure;
    wherein the method is characterized by:
    treating the documents of the set as hierarchically structured sets of units, with the respective document of the set consisting of several units, in such a way that the feature vectors, which are arranged in the matrix, are unit feature vectors, which are obtained by coding a respective unit of the respective document of the set each through a corresponding unit feature vector comprising a series of bits which respectively are set to a logical one if the respective associated feature of the certain features is present in the respective unit to code for the presence or absence of the certain features in the respective unit, so that the rows of the matrix each are associated to the respective unit of the respective document of the set and correspond to the respective unit feature vector coded therefor;
    obtaining scores from the result vector which represent as a similarity measure a frequency of occurrence of logical ones in the rows of the matrix at the positions indicated by the positions of logical ones in the query feature vector;
    adding for the documents of the set the scores which are obtained for the different units of the respective document to obtain a document score of each document of the set; and
    selecting for retrieval and retrieving a best document which has the highest document score and/or for which the document score fulfills a score threshold condition.

* * * * *